United States Patent [19]

Yu

[11] Patent Number: 5,751,032

[45] Date of Patent: May 12, 1998

[54] COLOR LINEAR CHARGE COUPLED DEVICE AND METHOD FOR DRIVING THE SAME

[75] Inventor: Young J. Yu, Seoul, Rep. of Korea

[73] Assignee: LG Semicon Co., Ltd., Chungcheongbuk-do, Rep. of Korea

[21] Appl. No.: 670,099

[22] Filed: Jun. 25, 1996

[30] Foreign Application Priority Data

Dec. 11, 1995 [KR] Rep. of Korea ............... 1995/48245

[51] Int. Cl.[6] ............... H01L 27/148; H01L 29/768; H01L 31/00

[52] U.S. Cl. ............... 257/233; 257/222; 257/231; 257/232; 257/234; 257/440; 257/444; 257/448

[58] Field of Search ............... 257/232, 233, 257/234, 440, 249, 444, 448

[56] References Cited

U.S. PATENT DOCUMENTS

| | | | |
|---|---|---|---|
| 5,237,190 | 8/1993 | Wu et al. | 257/234 |
| 5,280,186 | 1/1994 | Lee | 257/232 |
| 5,340,977 | 8/1994 | Kojima et al. | 250/208.1 |
| 5,345,319 | 9/1994 | Yu | 358/483 |
| 5,352,920 | 10/1994 | Morishita et al. | 257/435 |
| 5,436,493 | 7/1995 | Mantell | 257/440 |
| 5,506,430 | 4/1996 | Ohzu | 257/292 |

*Primary Examiner*—Mahshid D. Saadat
*Assistant Examiner*—Allan R. Wilson
*Attorney, Agent, or Firm*—Finnegan, Henderson, Farabow, Garrett & Dunner, L.L.P.

[57] ABSTRACT

A color linear charge coupled device for an image pickup apparatus includes red, green, and blue photo diode arrays. First, second, third and fourth transfer gates formed in the device move signal charges generated at the photo diode arrays toward first, second and third horizontal charge coupled device (HCCD) shift registers. By controlling the transfer gates, the red and green signal charges are first transferred to their HCCD shift registers. The blue signal charge is then transferred to its HCCD shift register. Only three HCCD shift registers are required, thus, the device dimension and configuration is considerably simplified compared to prior art configurations. Also, the color resolution of the device is greatly improved because the distance between the respective photo diode arrays is substantially decreased.

12 Claims, 5 Drawing Sheets

F I G. 4a
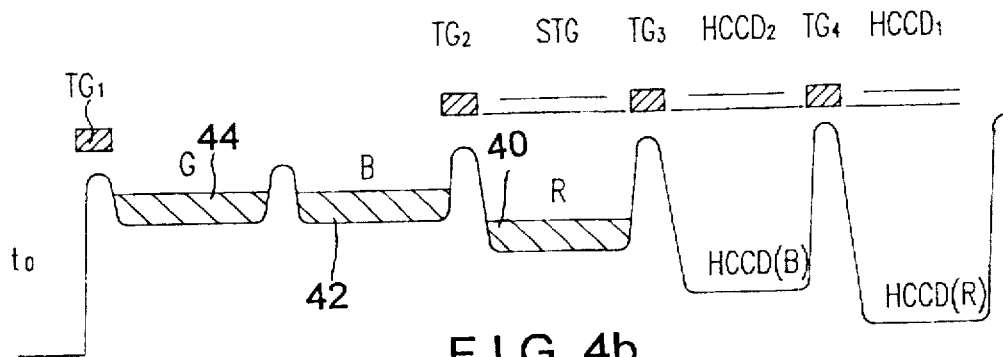
F I G. 4b
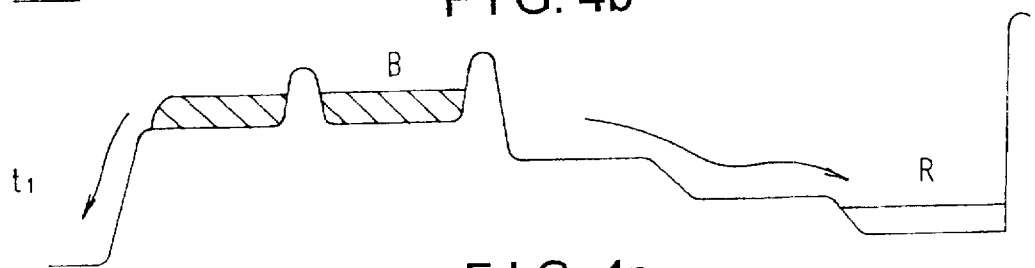
F I G. 4c
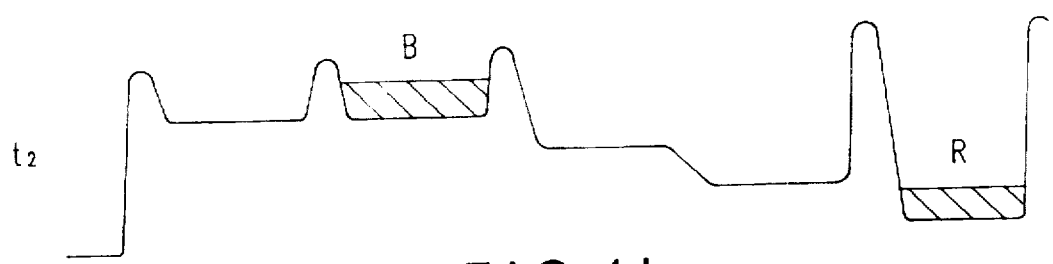
F I G. 4d
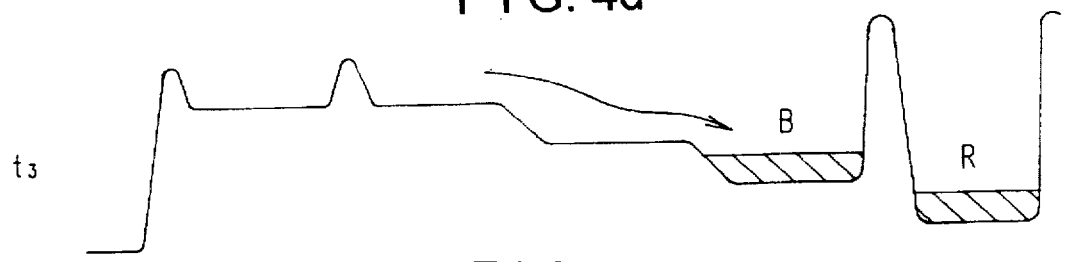
F I G. 4e

5,751,032

1

COLOR LINEAR CHARGE COUPLED DEVICE AND METHOD FOR DRIVING THE SAME

BACKGROUND OF THE INVENTION

The present invention relates to a color linear charge coupled device for an image pickup apparatus, and, more particularly, to a color linear charge coupled device (CCD) for improving color resolution by reducing the distance between the respective pixels, and a method of driving the same.

A conventional color linear CCD will be described with reference to FIG. 1, a schematic diagram of the conventional color linear CCD.

Each row of the CCD includes photo diode arrays 1, 2 and 3; transfer gates 5 positioned at both sides of photo diode arrays 1, 2 and 3; horizontal charge coupled device (HCCD) shift registers 4 surrounding the outer side of transfer gates 5; a floating diffusion element (FD) 7 positioned at one side of each CCD array; and a sensing amplifier 8 connected to FD 7.

The operation of the conventional color linear CCD will now be described. When transfer gate 5 is turned on, signal charges photoelectrically converted in each photo diode of the respective photo diode arrays 1, 2 and 3 move through their transfer gates 5 and to HCCD shift registers 4. The signal charges are moved either to their upper HCCD shift register or to their lower HCCD shift register based on the position of the charges' photodiode. In particular, the charges are moved in a zigzag manner such that charges from odd numbered photodiodes move to their upper HCCD shift register and charges from the even numbered photodiodes move to their lower HCCD shift register (or viceversa).

Subsequently, the charges in the shift registers are moved to the right by clock signals applied to HCCD shift registers 4 so that the signals can be sensed and extracted by FD 7 and sensing amplifier 8.

In summary, the red, the green and the blue linear CCD arrays have the same configuration and operate in the same manner, except for their color. Thus, the conventional color CCD requires two HCCDs, one FD, and one sensing amplifier for each row that senses a color—a less than compact design, which therefore increases the expense of the CCD. Also, because two transfer gates and two HCCDs are positioned in the spaces between the red, green, and blue CCD rows, the physical space between the respective CCD rows is large, thus deteriorating vertical color resolution.

SUMMARY OF THE INVENTION

To solve the problems of the conventional color linear CCD, it is an object of the present invention to provide a color linear CCD suitable for improving the color resolution by reducing the distance between the respective pixels and a method for driving the same.

To accomplish the above object, there is provided a color linear CCD comprising a semiconductor substrate of a first conductivity type and a well region of a second conductivity type, formed on the first conductivity type semiconductor. A photo diode array includes a red detecting photo diode array formed in the second conductivity type well region, a blue detecting photo diode array, and a green detecting photo diode array, the blue and green photo diode arrays separately formed on a first side of the red detecting photo diode array. The photo diode arrays generate signal charges by photoelectric conversion. A horizontal charge coupled device (HCCD) shift register portion has first and second HCCD shift registers, each separately formed on a second side, opposite the first side, of the red detecting photo diode array and a third HCCD shift register formed on the first side of the red detecting photo diode array. Finally, the linear CCD includes a first, second, third, and fourth transfer gates for moving signal charge.

BRIEF DESCRIPTION OF THE DRAWINGS

The above objects and advantages of the present invention will become more apparent by describing in detail a preferred embodiment thereof with reference to the attached drawings in which:

FIGS. 4a–4e are potential profiles of the color linear CCD at various times, according to the present invention.

DETAILED DESCRIPTION OF THE INVENTION

Figure 1:
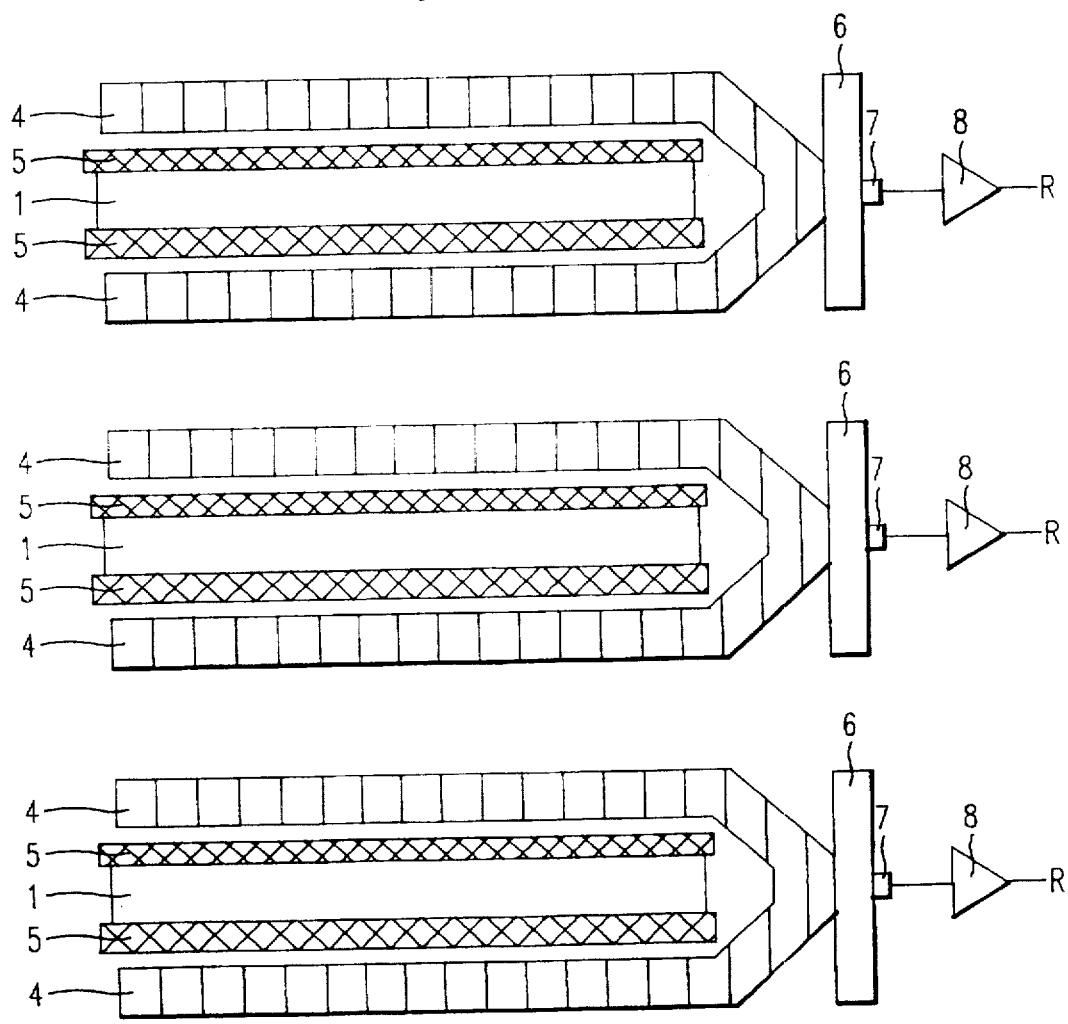
FIG. 1 is a schematic diagram of a conventional color linear CCD.
Figure 2:
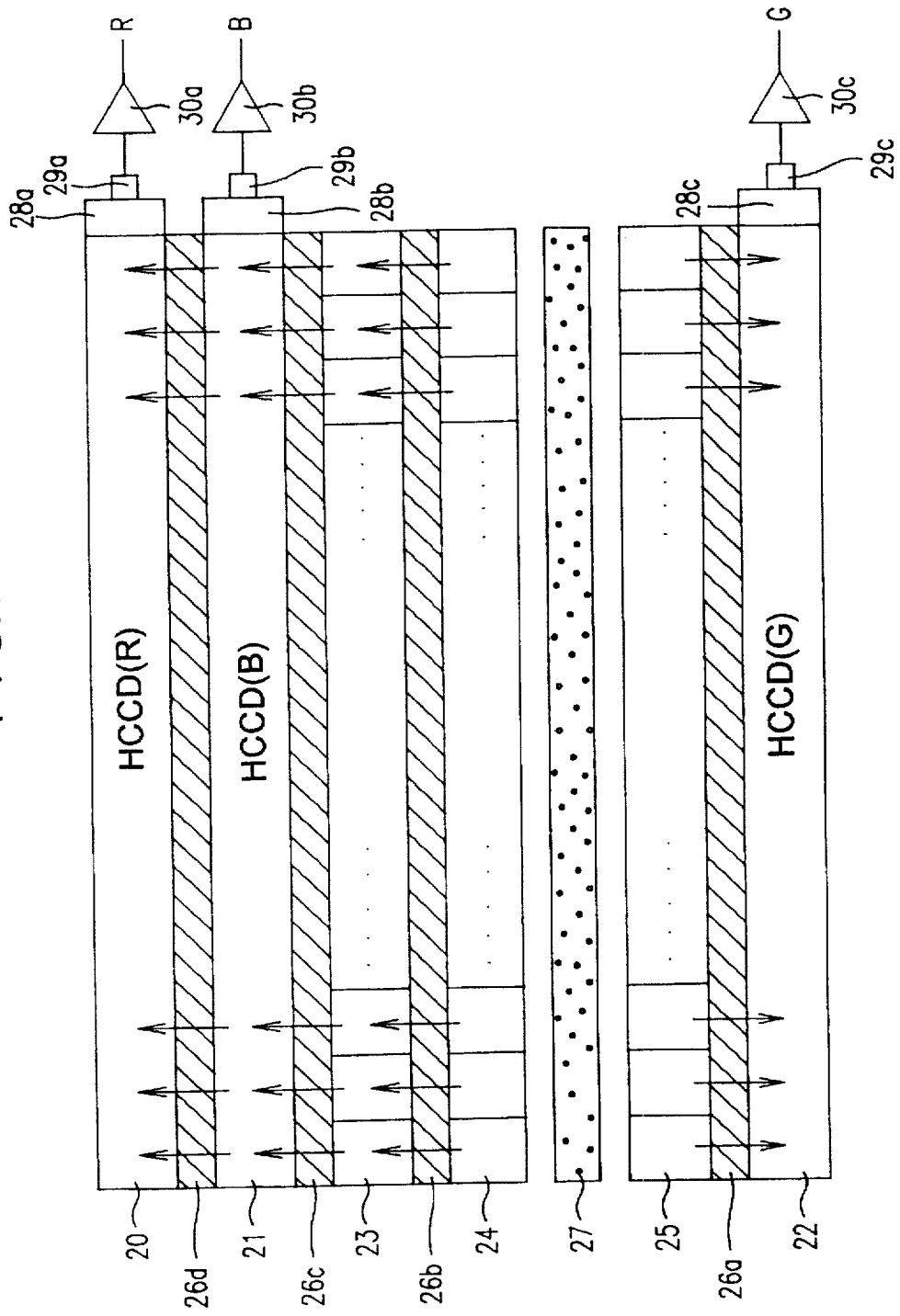
FIG. 2 is a schematic diagram of a color linear CCD according to the present invention.
Figure 3:
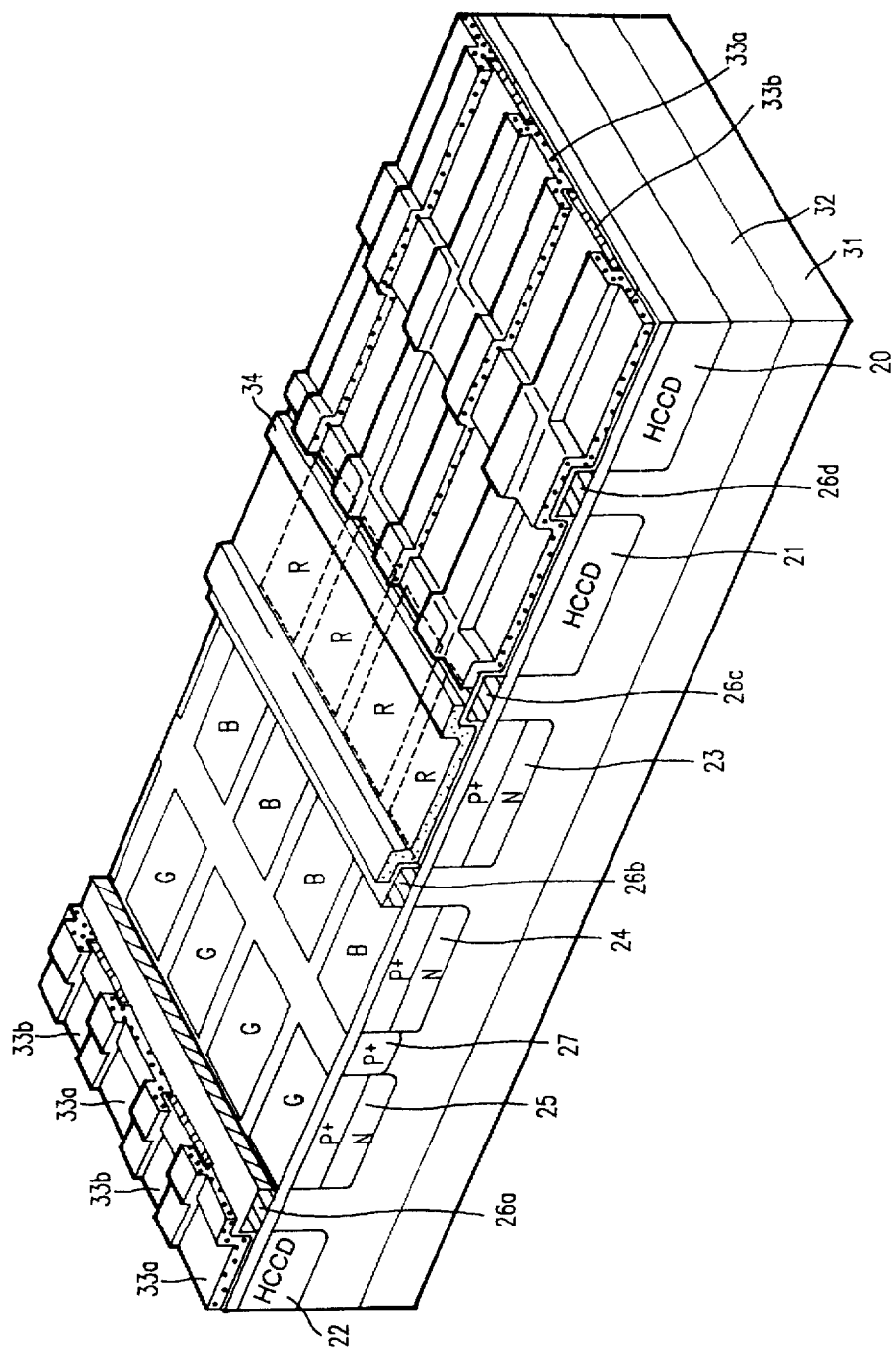
FIG. 3 is a vertical sectional view of the color linear CCD according to the present invention.

As shown in FIGS. 2 and 3, the color linear CCD according to the present invention includes a first conductivity type semiconductor substrate 31 and a second conductivity type well region 32 formed on the first conductivity type semiconductor substrate 32. A red detecting photo diode array 23, positioned in the central area of second conductivity type well region 32, generates signal charges by photoelectric conversion proportional to the amount of incoming red light. Similarly, a blue detecting photo diode array 24 and a green detecting photo diode array 25 are situated to one side of red detecting photo diode array 23. HCCD shift registers 20 and 21 are positioned on the other side of photo diode array 23. Shift register 20 receives the signal charges generated by the red photo diode array 23 and shift register 21 receives the signal charges generated by the blue photo diode array 24. Another HCCD shift register, shift register 22, is situated to one side of green detecting photo diode array 25 and receives the signal charges generated in green detecting photo diode array 25.

Transfer gates 26a, 26b, 26c, and 26d move the signal charges generated at the photo diodes by application of an ON/OFF signal. Transfer gate 26a moves signal charges from photo diode 25 to shift register 22. Transfer gate 26b moves signal charges from photo diode 24 towards shift register 21. Transfer gate 26c moves, at separate times, signal charges generated by photo diodes 23 and 24. Finally, transfer gate 26d moves signal charges from photo diode 23 to shift register 20.

Storage gate 34 is positioned on red detecting photo diode array 23 and controls the movement of the charges generated at blue detecting photo diode array 24. In particular, when a DC bias is applied to storage gate 34, the potential of red detecting photo diode array 23 drops below that of blue detecting photo diode array 24, and consequently, signal charge flow between photo diode 24 and shift register 21 is possible.

Output gates 28a, 28b, and 28c; FDs 29a, 29b and 29c; and sensing amplifiers 30a, 30b and 30c are formed on one side of HCCD shift registers 20, 21 and 22. Poly gates 33a and 33b are repeatedly formed as shown, over the HCCD shift registers 20, 21 and 22, to serially shift the signal charges toward the output gates 28a, 28b, and 28c. The transfer gates 26a, 26b, 26c, and 26d, and the storage gate 34 are also poly gates. Signals in the shift registers 20, 21, and 22 are serially shifted using the poly gates 33a and 33b, until they are sensed and extracted by FD 7 and sensing amplifier 8.

Channel stop layer 27 is formed by implanting high-concentration impurity ions of a second conductivity type in the separated area of the respective cells for isolation of the photo diode cells of the respective photo diode arrays 23, 24 and 25.

Figure 5A:
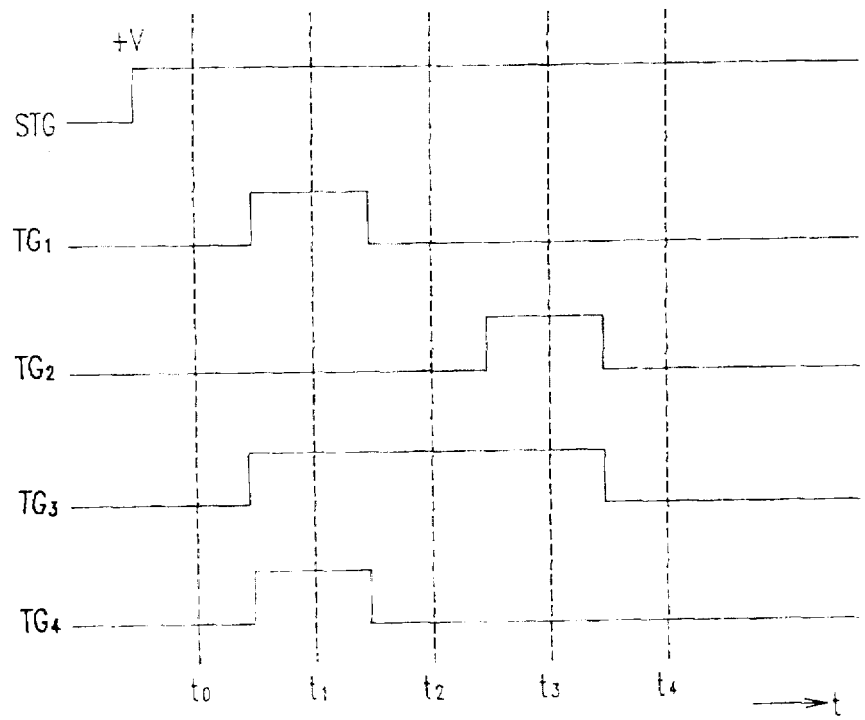
FIGS. 5a–5b are timing charts of the color linear CCD according to the present invention.

The operation of the present invention will now be described with reference to FIGS. 4 and 5.

At time t0, the signal charges photoelectrically converted in the respective photo diode arrays 23, 24, and 25 are shown as areas 40, 42, and 44, respectively. At time t1, transfer gates 26a (TG1), 26c (TG3), and 26d (TG4) are turned on, thus reducing their respective potential barriers, causing the signal charge from photo diode array 25 (green) and 23 (red) to move into their respective shift registers. At time t2, transfer gates 26a, 26b (TG2), and 26d are turned off, raising the illustrated potential barriers. At time t3, transfer gate 26b is turned back on, allowing signal charge from photo diode 24 to move into its shift register 21. Finally, at time t4, all of the transfer gates are off. Throughout the operation described in this paragraph, storage gate 34 (STG) remains on, thus holding the potential of the red photo diode below that of the blue and green photo diodes.

Because there is a charge stopping layer 27 positioned between green detecting photo diode array 25 and blue detecting photo diode array 24, signal charges are not mixed with each other.

Figure 5B:
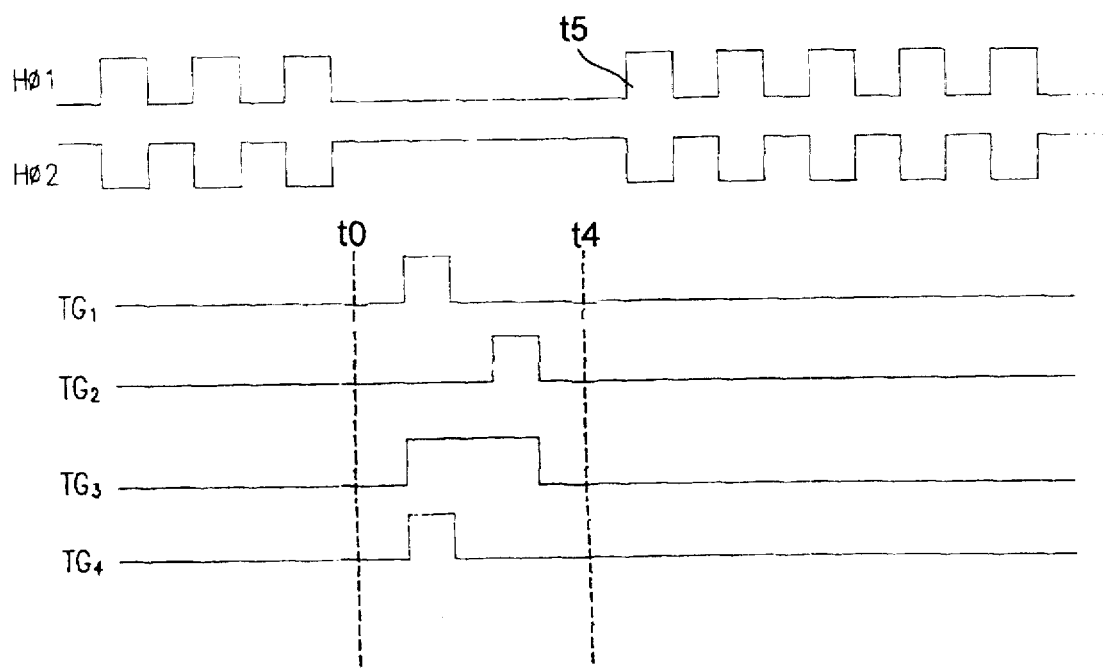

After the signal charges generated at the photo diode arrays 23, 24 and 25 are completely moved to HCCD shift registers 20, 21 and 22, clock signals are applied to second and third poly gates 33a and 33b of HCCD shift registers 20, 21 and 22 to move the signal charges to the output. In FIG. 5b, the clock signals applied to poly gates 33a and 33b are shown as signals H01 and H02. After the transfer gates 26a through 26d have finished switching, i.e. the signal charge has all been transferred to the shift registers 20, 21, and 22, at time t5, clock signals H01 and H02 are alternatively applied to poly gates 33a and 33b, as shown, to sequentially move the signal charges to the output gates 28a, 28b and 28c.

In the present invention, blue detecting photo diode array 24 is placed in the center to prevent the absorption of red components when the signal charges are moved to the HCCD shift registers 20 and 21 through the storage gate 34, improving the color resolution.

As described above, according to the color linear CCD of the present invention, the number of required HCCD shift registers is reduced, compared to conventional CCD arrays, considerably simplifying the device configuration and allowing improved color resolution because the distance between the respective photo diode arrays.

It will be apparent to those skilled in the art that various modifications and variations can be made in the present invention without departing from the scope or spirit of the invention.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A color linear charge coupled device (CCD) comprising:

a semiconductor substrate of a first conductivity type;

a well region of a second conductivity type formed on said first conductivity type semiconductor substrate;

a photo diode array portion having a red detecting photo diode array formed in a predetermined area of said second conductivity type well region, a blue detecting photo diode array, and a green detecting photo diode array, the blue and green photo diode arrays being separately formed on a first side of said red detecting photo diode array, the photo diode arrays generating signal charges by a photoelectric conversion;

a horizontal charge coupled device (HCCD) shift register portion having first and second HCCD shift registers each separately formed on a second side, opposite the first side, of said red detecting photo diode array and a third HCCD shift register formed on the first side of the red detecting photo diode array;

a first transfer gate for moving signal charge;

a second transfer gate for moving signal charge;

a third transfer gate for moving signal charge;

a fourth transfer gate array for moving signal charge; and a storage gate provided on said red detecting photo diode array for controlling the movement of the charges generated at said blue detecting photo diode array.

2. The color linear charge coupled device as claimed in claim 1, wherein said second HCCD shift register moves the signal charges generated at said blue detecting photo diode array in a specific direction.

3. The color linear charge coupled device as claimed in claim 1, wherein said first HCCD shift register moves the signal charges generated at said red detecting photo diode array in a specific direction.

4. The color linear charge coupled device as claimed in claim 1, wherein said third HCCD shift register moves the signal charges generated at said green detecting photo diode array in a specific direction.

5. The color linear charge coupled device as claimed in claim 1, wherein said first transfer gate is positioned near said green detecting photo diode array and moves the signal charge generated at said green detecting photo diode array toward said third HCCD shift register.

6. A color linear charge coupled device as claimed in claim 1, wherein said second transfer gate is formed between said blue and red detecting photo diode arrays and moves the signal charge from said blue detecting photo diode array.

7. A color linear charge coupled device as claimed in claim 1, wherein said third transfer gate is positioned on the second side of said red detecting photo diode array and moves signal charge from said blue and red detecting photo diode arrays.

8. A color linear charge coupled device as claimed in claim 1, wherein said fourth transfer gate moves signal charge from said red detecting photo diode array.

9. A color linear charge coupled device as claimed in claim 1, wherein said blue detecting photo diode array and said red detecting photo diode array are isolated by a channel stop layer formed by implanting high-concentration impurity ions of a second conductivity type.

10. A color linear charge coupled device (CCD) comprising:

a first detecting photo diode array for generating first signal charges by photoelectric conversion;

a first transfer gate for moving the first signal charges, the first transfer gate positioned adjacent to the first detecting photo diode array;

a second detecting photo diode array for generating second signal charges by photoelectric conversion, the second detection photo diode array positioned adjacent to the first transfer gate and on the side of the first transfer gate opposite the first detecting photo diode array;

a second transfer gate for moving the first and second signal charges, the second transfer gate positioned adjacent to the second detecting photo diode and on the side of the second detecting photo diode opposite the first transfer gate, the second transfer gate being operated so that the signal charges from the second detecting photo diode are moved through the second transfer gate, and subsequently, the signal charges from the first detecting photo diode are moved through the second transfer gate; and a storage gate provided on said second detecting photo diode array for controlling the movement of the signal charges by holding a potential of the second detecting photo diode array below a potential of the first detecting photo diode array throughout the operation of the second transfer gate.

11. The color linear charge coupled device (CCD) of claim 10, the first photo diode array being constructed to detect blue light.

12. The color linear charge coupled device (CCD) of claim 10, the second photo diode array being constructed to detect red light.

* * * * *